(12) United States Patent
Rice

(10) Patent No.: US 6,624,003 B1
(45) Date of Patent: Sep. 23, 2003

(54) INTEGRATED MEMS DEVICE AND PACKAGE

(75) Inventor: Janet L. Rice, Round Rock, TX (US)

(73) Assignee: Teravicta Technologies, Inc., Austin, TX (US)

( * ) Notice: Subject to any disclaimer, the term of this patent is extended or adjusted under 35 U.S.C. 154(b) by 0 days.

(21) Appl. No.: 10/068,259

(22) Filed: Feb. 6, 2002

(51) Int. Cl.$^7$ ................................................ H01L 21/44
(52) U.S. Cl. ........................ 438/106; 438/126; 438/127; 438/115
(58) Field of Search ................................ 438/106, 108, 438/115, 125, 126, 127

(56) References Cited

U.S. PATENT DOCUMENTS

| | | | |
|---|---|---|---|
| 5,234,152 A | 8/1993 | Glaeser | |
| 5,604,160 A | 2/1997 | Warfield | |
| 5,694,740 A | 12/1997 | Martin et al. | |
| 5,798,557 A | 8/1998 | Salatino et al. | |
| 5,891,751 A | 4/1999 | Kurtz et al. | |
| 6,040,235 A | 3/2000 | Badehi | |
| 6,072,236 A | 6/2000 | Akram et al. | |
| 6,124,634 A | 9/2000 | Akram et al. | |
| 6,195,047 B1 * | 2/2001 | Richards | 343/700 |
| 6,214,644 B1 | 4/2001 | Glenn | |
| 6,225,692 B1 | 5/2001 | Hinds | |
| 6,297,072 B1 * | 10/2001 | Tilmans et al. | 438/106 |
| 6,384,353 B1 * | 5/2002 | Huang et al. | 200/181 |

OTHER PUBLICATIONS

"VIA/PLANE®: An Enabling Interconnect Substrate," ©1998 Micro Substrates Corp., pp. 1–3.
"Ceramic Hybrid Electromechanical Systems," NASA's Jet Propulsion Laboratory, 2 pgs.

* cited by examiner

Primary Examiner—David Nelms
Assistant Examiner—Thao P Le
(74) Attorney, Agent, or Firm—Kevin L. Daffer; Conley Rose P.C.

(57) ABSTRACT

A microelectromechanical circuit includes a packaging substrate having conductive features on its lower surface. The circuit may further include a microelectromechanical device formed upon the upper surface of the substrate, wherein an underside of at least one element of the device is in contact with the upper surface of the substrate. In some embodiments, the circuit may include one or more covers spaced above the substrate and the device. The circuit may further include a sealing structure laterally surrounding the device and interposed between the substrate and the covers. An array of microelectromechanical circuits may include a packaging substrate with first and second microelectromechanical devices laterally spaced upon its upper surface, first and second covers above the substrate and the first and second devices, and a sealing structure between the substrate and the first and second covers. A method for forming a microelectromechanical device may include forming the device upon a packaging substrate having one or more conductive features upon its lower surface.

24 Claims, 3 Drawing Sheets

US 6,624,003 B1

INTEGRATED MEMS DEVICE AND PACKAGE

BACKGROUND OF THE INVENTION

1. Field of the Invention

This invention pertains to microelectromechanical devices and circuits, and more particularly, to formation of such devices within and upon an integrated package.

2. Description of the Related Art

The following descriptions and examples are not admitted to be prior art by virtue of their inclusion within this section.

Microelectromechanical devices, or devices made using microelectromechanical systems (MEMS) technology, are of interest in part because of their potential for providing miniaturized sensors and actuators and performing functions not done or poorly done by semiconductor integrated circuit (IC) technology. As compared to transistor switches formed with conventional IC technology, for example, MEMS switches may exhibit lower losses and a higher ratio of off-impedance to on-impedance. Although the fabrication steps used to form MEMS devices are similar to those for forming integrated circuits, packaging of MEMS devices presents some additional complexity. Because MEMS devices tend to have moving parts, they cannot be encapsulated in the manner used for protection of purely electronic circuits. Instead, a hermetically sealed enclosure, or "cavity", around the MEMS device typically needs to be formed. The final step in fabrication of the MEMS device itself is typically a "release" of the device, in which a sacrificial layer is removed so that the device may move freely. The release process may be quite critical, involving, for example, careful anneals, etching and drying processes. After release of the MEMS device, any processing steps which may contaminate the device must be avoided until the protective enclosure around the device is formed.

As is done in IC manufacturing, many MEMS devices (or circuits) are typically formed on a single substrate, which is subsequently diced, or singulated, to separate the individual devices. The dicing is typically done using a saw, and is a particularly "dirty" and mechanically stressful process. Therefore it is preferable that MEMS have enclosures formed over them if they are released before dicing (also referred to as being released at "wafer level"). Alternatively, the devices may be singulated first and then released before additional packaging is done. In either case, the individual MEMS die are typically put into packages fairly similar to IC packages. The packaging could involve, for example, attaching the back side of the MEMS device substrate to the top side of a packaging substrate, then wire-bonding contact pads on the top side of the MEMS device substrate to contact pads on the packaging substrate, and affixing a cap to form the sealed cavity over the MEMS device (unless the device was already covered prior to singulation). This type of packaging scheme has disadvantages, however. For example, the individual handling of each die needed to place it into a package is expensive and potentially unreliable. The package size also has to be relatively large in order to accommodate the MEMS chip substrate and the wire bonds. Furthermore, the use of wire bonding can limit the performance of high-frequency devices by introducing parasitic impedances.

One alternative approach, also used in IC packaging, is to eliminate wire bonds through flip-chip bonding with solder bumps or balls. If the solder bumps are large enough, a MEMS chip can be flip-chip bonded to a packaging substrate with enough clearance for the (now upside-down) MEMS device to operate. An enclosure can be formed around the MEMS device using the packaging substrate, MEMS substrate, and an additional underfill material applied laterally around the device, as described in U.S. Pat. No. 6,214,644. Although this flip-chip approach may improve the reliability and performance of the package connections by removing the wire bonds, it is still necessary to handle individual MEMS die one at a time during packaging, and to perform multiple packaging steps (e.g. forming solder bumps, flip-chip bonding, underfill application and cure).

It would therefore be desirable to develop a MEMS packaging method and structure which reduces the need for individual device handling, improves package size and cost, and improves high-frequency performance.

SUMMARY OF THE INVENTION

The problems outlined above may be in large part addressed by formation of a MEMS device upon a packaging substrate, rather than upon a separate device substrate. A packaging substrate as used herein is a substrate similar to those used in packaging of integrated circuits. A packaging substrate is formed from an insulating material and includes conductive features on its lower surface. The conductive features, which may include conductive pads, pins, bumps or balls, are adapted for use in electrical coupling of the substrate to a circuit board or other circuit carrier. "Circuit board" as used herein may refer to a circuit board, carrier, or other surface to which a miniature circuit may be mounted. The packaging substrate may also include conductive interconnects extending within and through the substrate, where the interconnects are adapted to connect the conductive features to the upper surface of the substrate. The "upper surface" of the substrate as used herein is the surface upon which an IC would be mounted if the substrate were used in an IC-mounting context, while the "lower surface" is the surface that would face the circuit board in such a context. When a MEMS device is formed upon a packaging substrate, the underside of at least one element of the device is in contact with the upper surface of the substrate. This is in contrast to formation of the MEMS device upon a separate MEMS substrate, which might then be mounted upon the packaging substrate (either die-up mounting which would typically include wire bonds, or flip-chip, die-down mounting). In an embodiment, the underside of the MEMS device element may be formed upon an exposed end of a conductive interconnect within the substrate, allowing electrical coupling of the device element to the lower surface of the substrate or to another device or circuit formed on the substrate. Alternatively, the device element may be connected to an interconnect within the substrate through an interconnect formed on the surface of the substrate.

An embodiment of a microelectromechanical circuit as contemplated herein may further include a cover spaced above the device and the substrate. The cover may be spaced sufficiently above the device to permit proper electromechanical operation of the device. The circuit may further include a sealing structure interposed between the substrate and cover, where the sealing structure laterally surrounds the device. The sealing structure may include, for example, an adhesive or a metal layer. In an embodiment, the substrate, cover and sealing structure combine to form a protective enclosure around the device. In an additional embodiment of the microelectronic circuit, an IC may be mounted on the packaging substrate in a position laterally spaced from that of the MEMS device. The IC may be electrically coupled to the MEMS device by wire bonds or through interconnects within the substrate, and may be included within a protective enclosure formed around the device. In some embodiments, the IC may alternatively be external to the protective enclosure.

Some embodiments of the circuit described herein are believed to provide cost, manufacturability, and/or performance advantages. For example, multiple MEMS devices may be formed simultaneously upon a packaging substrate. In a preferred embodiment, the devices may be released and then covered before dicing. At the time of dicing, the MEMS devices are already packaged and protected. The devices may therefore be ready for assembly to a circuit board or carrier, with no further packaging required. Costly and unreliable handling of individual devices during packaging may therefore be avoided. Fabrication of the packaged MEMS device is believed to be relatively simple and inexpensive in some embodiments, since after formation and release of the device, the only remaining steps may be affixing a cover and dicing. Affixing of the cover may be done individually on each of the multiple devices, or at the "wafer level" on the devices as a group. High-frequency performance of the MEMS device may also be improved in some embodiments, since wire bonds and bulky packages are replaced with the low-loss, low-inductance conductive interconnects within the package substrate. The package size may also be reduced, since clearance is not needed for mounting of an additional MEMS substrate or for wire bonds.

In addition to the microelectromechanical circuit described above, an array of microelectromechanical circuits is contemplated herein. In an embodiment, the array includes first and second microelectromechanical devices formed laterally spaced upon the upper surface of a packaging substrate, first and second covers spaced above the substrate and the first and second devices, respectively, and a sealing structure interposed between the substrate and the first and second covers, where the sealing structure laterally surrounds each of the first and second devices. In an embodiment, the first and second covers may be portions of a single cover for the array. The substrate, sealing structure, and first and second covers may combine to form a protective enclosure for each of the first and second devices. In such an embodiment, the protective enclosures are adapted to remain intact after separation of the substrate portions underlying the first and second devices (singulation of the devices). In a further embodiment, the first and second devices are adapted to be operable through application of electrical signals to appropriate conductive features on the lower surface of the substrate, either before or after singulation.

A method of forming a microelectromechanical device includes forming the device upon a packaging substrate having one or more conductive features upon its lower surface, where an underside of at least one element of the device is in contact with the upper surface of the substrate. Forming the device may include patterning a conductive layer deposited upon the packaging substrate, and may further include releasing the device to permit electromechanical operation. The method may further include affixing a cover to the substrate, where the cover is spaced above the device. Affixing the cover may include interposing a sealing structure between the substrate and the cover, and the substrate, cover and sealing structure may combine to form a protective enclosure around the device. In such an embodiment, the method may also include simultaneously forming an additional enclosed device laterally spaced upon the substrate, where the additional device is covered by an additional cover and laterally surrounded by an additional sealing structure. The additional cover and the cover may in an embodiment be portions of a single larger cap, and the additional sealing structure and the sealing structure may be portions of a single larger sealing layout. The method may further include separating the device from the additional device, where the device and the additional device each remains protectively enclosed after the separation.

BRIEF DESCRIPTION OF THE DRAWINGS

Other objects and advantages of the invention will become apparent upon reading the following detailed description and upon reference to the accompanying drawings in which.

Figure 1:
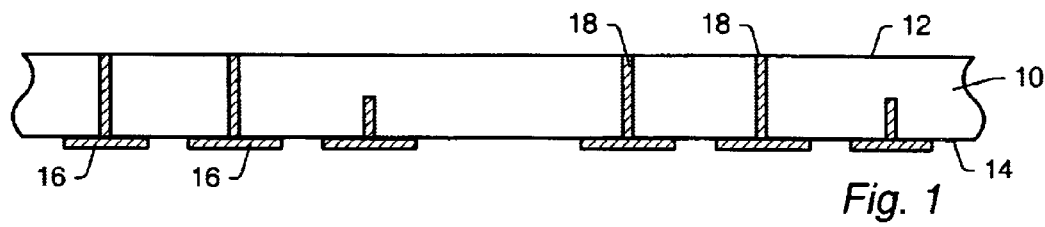
FIG. 1 is a partial cross-sectional view of an embodiment of a packaging substrate which may be used in formation of a microelectromechanical device as described herein.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

A partial cross-sectional view of an embodiment of a packaging substrate which may be used in forming a MEMS device as described herein is shown in FIG. 1. Substrate 10 includes an upper surface 12 and lower surface 14. As noted above, the "upper surface" is the surface upon which an integrated circuit might be mounted if the substrate were used for IC packaging, while the lower surface is the surface facing a circuit board if the packaging substrate is mounted to a circuit board. Conductive features 16 are formed on lower surface 14 of substrate 10. The conductive features may be conductive pads, as shown in FIG. 1. Alternatively, the features may be other types of features useful for connection of substrate 10 to a circuit board or carrier, such as pins, solder bumps, or solder balls. In general, conductive features 16 may be adapted for use in electrical coupling of substrate 10 to such a circuit board (not shown). Because FIG. 1 is a cross-sectional view, there may be many other conductive features 16 not shown in FIG. 1. Substrate 10 may also extend laterally to the left and right beyond the edges shown in FIG. 1, but is cut off in the drawing merely for simplifying the illustration. For example, substrate 10 may be a 4-inch×4-inch square in some embodiments. In other cases, substrate 10 may include other shapes and/or sizes, depending on the design specifications of the fabrication process.

Conductive interconnects 18 may extend within and through substrate 10. Depending on the particular device and/or circuit configuration, an interconnect 18 may have functions such as connecting a conductive feature 16 to upper surface 12 of the substrate, connecting different ones of features 16 to one another, or connecting together different points or features on upper surface 12. The configuration of interconnects 18 in FIG. 1 is merely exemplary, and actual configurations could be entirely different and considerably more complex. In the configuration of FIG. 1, interconnects for which both ends are not shown are interconnects which "turn a corner" and extend in a direction out of the plane of the cross-section shown.

FIG. 1, along with the other drawing described herein, is not necessarily drawn to scale. In an embodiment, substrate 10 has a thickness from approximately 0.25 mm to a few mm, and interconnects 18 have diameter from approximately 0.05 mm to approximately 1 mm. Other dimensions may also be suitable, however, depending on the particular requirements and formation process for the substrate. For example, if substrate 10 is made from ceramic, a suitable substrate thickness may be from about 0.025 mm to about 1 mm, and interconnect diameter from about 0.05 mm to about 0.02 mm. For a substrate made from a circuit board material, the preferred substrate thickness and interconnect diameter may be larger. In a currently preferred embodiment, substrate 10 is formed from aluminum oxide (alumina) and interconnects 18 are formed from copper a tungsten-copper composite. Such a substrate is available from vendors such as Micro Substrate Corporation of Tempe, Ariz., or CirQon Technologies Corporation of Gurnee, Ill. Substrate 10 could also be formed form any other material capable of having interconnects formed within or upon it. Such materials may include, for example, other ceramics, glass, quartz, or semiconductors. Semiconductor substrate could include integrated circuits in addition to the interconnect 18. Other possibilities include printed circuit board type materials such as polyinides, epoxies or other organic materials. Similarly, interconnects 18 could be formed from other conductors such as metals and/or metal alloys, subject to appropriate considerations such as adhesion and thermal properties. Conductive features 16 may or may not be formed from the same material as interconnects 18. For example, conductive features 16 may advantageously include a solderable material such as nickel with a thin gold coating.

Figure 2:
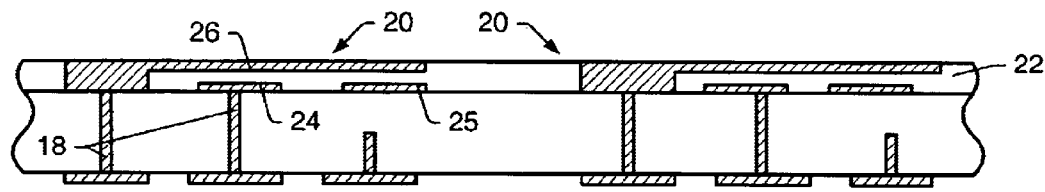
FIG. 2 shows the packaging substrate of FIG. 1 with exemplary MEMS devices formed upon it.

The formation of MEMS devices 20 and sacrificial layer 22 on upper surface of substrate 10 is illustrated in FIG. 2.

Although FIG. 2 shows two MEMS devices upon substrate 10, multiple other devices may be formed upon substrate 10. In particular, multiple other devices may be formed upon portions of substrate 10 not shown in the partial cross-sectional view of FIG. 2. In some embodiments, multiple MEMS devices and/or semiconductor-based integrated circuits may be arranged upon substrate 10. In addition, the multiple devices may be arranged upon substrate 10 such that each device may be separately packaged and/or that sufficient space may be left between the devices for subsequent singulation of substrate 10, as discussed in the description of FIG. 6 below. In some cases, one or more of the devices may be arranged upon substrate 10 such that at least one element of the one or more devices is coupled to an interconnect 18. In this manner, the one or more devices may be electrically coupled to other devices arranged upon substrate 10 through interconnect 18. In particular, MEMS devices 20 shown in FIG. 2 may be electrically coupled to each other through interconnects 18 or interconnects running on the top surface of the substrate 10. In addition or alternatively, one or more of MEMS devices 20 may be electrically coupled to a semiconductor-based integrated circuit formed upon substrate 10 (not shown). In an embodiment, the one or more devices are electrically coupled to devices which are arranged within the same die portion of the substrate. In this manner, the devices may be adapted to be operable through application of electrical signals through conductive features within and on substrate 10 both before and after the singulation process described in reference to FIG. 6 below.

Although device 20 of FIG. 2 is shown as a cantilever switch for simplicity, any of various other MEMS devices could also be formed, including other switches, sensors, actuators, variable capacitors, and optical devices. In the embodiment of FIG. 2, device 20 is an electrostatically actuated switch, in which a voltage may be applied to control gate 24 to bring cantilever arm, or beam, 26 into or out of contact with contact pad 25. Other MEMS devices could be formed that use other forms of actuation, however, such as magnetic or thermal actuation. In an embodiment for which multiple devices are formed within a single die area, the devices may be of the same type or of different types. The dimensions of elements of MEMS device 20 may depend on the particular device type and purpose of the device. In some embodiments, for example, the vertical gap between control element 24 and the suspended element 26 may be on the order of one to ten microns. In addition or alternatively, the width of cantilever element 26 and lateral dimensions of elements 24 and 25 may be on the order of tens to hundreds of microns, while the length of the cantilever may be on the order of tens to hundreds of microns. Larger or smaller dimensions, however, may be used depending on the design specifications of the device and the particular materials and process used. A method of forming MEMS devices 20 and sacrificial layer 22 may include depositing and patterning a conductive layer to form elements 24 and 25, and subsequently depositing sacrificial layer 22 upon these elements and exposed portions of substrate 10. In some embodiments, the formation of MEMS devices 20 may further include patterning an opening within sacrificial layer 22 and subsequently depositing a conductive layer to form the support portion of suspended element 26. In other embodiments, the support portion of element 26 may be formed prior to the deposition of sacrificial layer 22 and the suspended element 26 may be deposited separately after completion of the sacrificial layer. The dimensions and fabrication methods described here may vary for other types of MEMS devices, as will be clear to one of ordinary skill in the art of MEMS fabrication having the benefit of this disclosure.

In general, sacrificial layer 22 and the conductive layers used to form elements 24 and 25 and suspended element 26 may be formed using various techniques, including chemical vapor deposition, physical vapor deposition techniques such as evaporation or sputtering, and electrochemical plating, or combinations of such methods. In addition, patterning of the conductive layers and sacrificial layer 22 may be done by lithography and etching techniques used in semiconductor fabrication processes. In some embodiments, the thickness of sacrificial layer 22 may be on the order of a few microns, or more specifically between about 1 and about 10 microns. A suitable thickness for the conductive layers may be from about 0.1 micron to about 10 microns. In one embodiment, the thickness of the conductive layers may be between approximately 1 micron and approximately 5 microns. However, thinner or thicker layers may be used for sacrificial layer 22 and the conductive layers depending on the design specifications of the device and the particular materials and process used.

Element 24 and cantilever element 26 may include a variety of materials. For example, element 24 and cantilever element 26 may include conductive materials, such as doped polysilicon or metals such as, gold, copper, nickel, titanium, tungsten, or an alloy of such metals. In addition or alternatively, element 24 and/or cantilever element 26 may include dielectric materials, such as polyimide, silicon nitride, silicon oxide, or silicon oxynitride. Furthermore, element 24 and/or cantilever element 26 may include adhesion layers or layers for promoting good electrical contact with upper ends of interconnects 18. In some embodiments, element 24 and cantilever element 26 may include the same materials. Alternatively, element 24 and cantilever element 26 may include different materials. In addition, sacrificial layer 22 may include any material suitable for patterning and that has sufficiently different etch characteristics than the materials used for element 24 and cantilever element 26. In this manner, sacrificial layer 22 may be selectively removed during the releasing process as discussed in the description of FIG. 3 below. In some embodiments, sacrificial layer 22 may include a dielectric material, such as silicon oxide or nitride, silicon oxynitride or polyimide, or a metal such as, gold, copper, nickel, titanium, tungsten, or an alloy of such metals.

Figure 3:
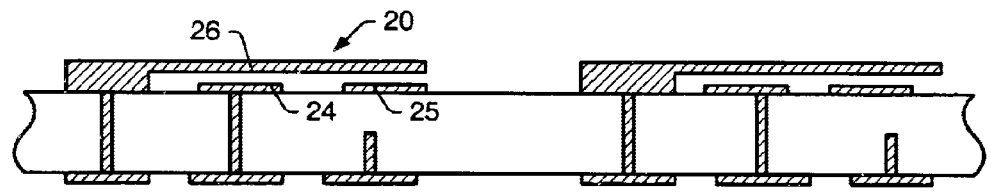
FIG. 3 shows the MEMS devices of FIG. 2 after they are "released;"

FIG. 3 illustrates the "release" of MEMS devices 20. In other words, FIG. 3 illustrates the topography subsequent to the removal of all or at least a portion of sacrificial layer 22. Such a removal of sacrificial layer 22 is preferably done at least between elements 24 and 25 and cantilever element 26 in each of devices 20. Consequently, the release process may allow cantilever elements 26 to be freestanding. As such, the release process may permit electromechanical operation of MEMS devices 20. In some cases, the release process may further include a thermal treatment process before or after removal of layer 22 to optimize the performance of the devices.

Although the method and structure described herein are believed to allow release of multiple devices at once, in some cases it may be preferable to release only subsets of the devices at a time. Therefore, in some embodiments, substrate 10 may be divided into smaller portions using a dicing tool such as a saw or laser prior to releasing the devices. For example, in an embodiment in which substrate 10 includes a 4-inch×4-inch square, substrate 10 may be cut into 2-inch× 2-inch square portions before the release process. Substrate 10, however, may be cut into different size and/or shaped portions depending on the particular materials and process used. If cut at all before releasing of the devices, substrate 10 is preferably cut into portions that still include multiple circuits formed thereon. In other words, the substrate is preferably maintained in portions that include more than one die. In this manner, covers may be formed over a plurality of circuits at one time, thereby lowering fabrication costs and time. As such, the aforementioned cutting process may be distinct from the singulation process described below, in which sealed substrate 10 is divided into single, packaged circuits.

In some embodiments, the devices formed upon substrate 10 may be tested subsequent to the release of MEMS devices 20. In particular, the devices formed upon substrate 10 may be tested subsequent to the release of MEMS devices 20, but prior to covering the devices as described below. Such a test process may be conducted through test pads formed upon the top of substrate 10, for example, or through contact pads 16 on the bottom of the substrate. The incorporation of the testing process at such a point in the fabrication process may be particularly advantageous in embodiments in which separate covers are formed over each device as discussed further in the description of FIG. 5 below. In this manner, placing covers on devices, which fail testing procedures, may be avoided. In other embodiments, the devices may be tested subsequent to the singulation process as described below in reference to FIG. 6.

Figure 4A:
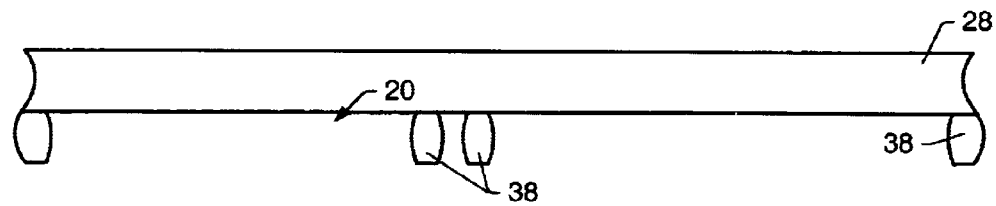
FIG. 4A is a partial cross-sectional view of an embodiment of a cover which may be affixed to the substrate of FIG.3.
Figure 4B:
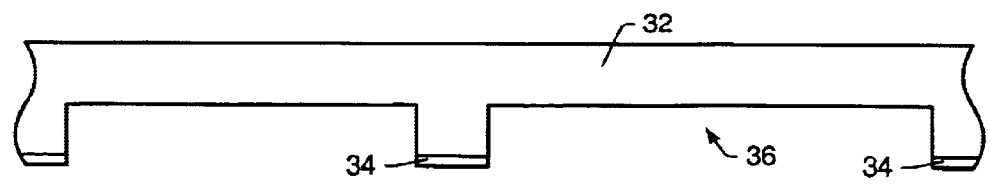
FIG. 4B is a partial cross-sectional view of an alternative embodiment of a cover.

Regardless of whether the devices are tested before or after the singulation of substrate 10, the released MEMS devices are preferably protected before the singulation process is performed. FIGS. 4A and 4B illustrate partial cross-sectional views of exemplary embodiments of covers which may be affixed over MEMS devices 20 of FIG. 3. Such covers may protect MEMS devices 20 from handling processes or the introduction of contamiants. The cover of FIG. 4A includes cover plate 28 and sealing layer 30. In some embodiments, sealing layer 30 may be attached to the lower surface of cover plate 28. In yet other embodiments, some or all of sealing layer 30 may be deposited on substrate 10 as discussed further in the description of FIG. 7 below. In some embodiments, sealing layer 30 may be arranged in a pattern. For example, in some embodiments, sealing layer 30 may include an array of laterally arranged structures, such as but not limited to, rings or grids. In addition or alternatively, sealing layer 30 may include one or more layers. In general, sealing layer 30 maybe adapted to seal devices around which the layer is arranged such that a protective enclosure around devices is formed. Preferably, sealing layer 30 is thick enough such that the protective enclosure will give the devices enough room to operate. In some embodiments, for example, sealing layer 30 may have a thickness on the order of a few microns to the order of a few hundreds of microns. Larger or smaller thicknesses of sealing layer 30, however, may be appropriate depending on the design specifications of the circuit.

In some cases, substrate 10, sealing layer 30, and cover plate 28 may together form a protective enclosure around the device. In some embodiments, the protective enclosure may be about a single device. In other embodiments, the protective enclosure may be about multiple devices. In particular, sealing layer 30 may be arranged about one or multiple devices. In addition or alternatively, cover plate 28 may be arranged over one or multiple devices. In the embodiment illustrated in FIG. 4A, cover plate 28 may be adapted to be arranged over MEMS devices 20 illustrated in FIG. 3 and sealing layer 30 may be adapted to be arranged around each of MEMS devices 20.

In some embodiments, cover plate 28 may include a ceramic material, such as alumina. The use of such a material may be particularly advantageous when substrate 10 includes a ceramic material. However, other materials such as, glass, silicon, kovar, quartz, metal, semi-insulating semiconductors, polymer, and other ceramics, may be used for cover plate 28. In addition, cover plate 28 may or may not include the same material as substrate 10. Depending on the sealing method used, sealing layer 30 may include solder, metal, ceramic, glass, or a polymeric adhesive such as a thermoplastic, elastomeric or epoxy. For example, sealing layer 30 may include a metal when the devices are sealed by soldering or thermocompression bonding or other metal to metal bonding technique. In other cases, sealing layer 30 may include ceramic or glass when frit sealing or fusing is used to seal the devices. In yet other embodiments, sealing layer 30 may include partially cured epoxy printed onto ceramic, or a thermoplastic bonding material that has been applied to the ceramic prior to placement or is placed as a separate layer before bonding. In an embodiment in which a transparent material is used for substrate 10, sealing layer 30 may include UV curable adhesive such that curing process of the sealing layer as described below may be eliminated. This approach may be especially well suited for packaging optical MEMS devices.

An alternative embodiment of a cover used for protecting MEMS devices 20 of FIG. 3 is illustrated in FIG. 4B. Such a cover may include cover plate 32 with recesses 36. Preferably recesses 36 are arranged within the lower surface of cover plate 32 such that recesses 36 may be aligned over devices when cover plate 32 is coupled to a substrate. Recesses 36 may be formed within cover plate 32 in a variety of manners and may depend on the material of cover plate 32. For example, etching of recesses 36 may be used when cover plate 32 includes a semiconductor material. Other recess formation methods may include molding of polymer cover plates, embossing or photo-chemical machining of metal cover plates, stacking of unfired ceramic sheets and firing to form a three dimensional structure and ultrasonic machining of glass cover plates. Regardless of the material of cover plate 32, recesses 36 are preferably deep enough such that underlying devices have enough room to operate upon coupling the cover to the substrate. In this manner, recesses 36 may be laterally arranged about one or more devices upon coupling the cover plate 32 to substrate 10 in some embodiments. As such, cover plate 32 and substrate 10 may alone, in some embodiments, be used to form an enclosure about one or more devices. Exemplary techniques for affixing a cover directly to a substrate may include anodic bonding between a semiconductor and a glass, or direct bonding of two semiconductors. (For these particular methods, one or both of the substrate and cover would be formed from a semiconductor.) Consequently, a cover such as that of FIG. 4B may not include a sealing layer in some embodiments.

Alternatively, the cover may include sealing layer 34 arranged upon unrecessed portions of cover plate 32 as shown in FIG. 4B. In yet other embodiments, some or all of sealing layer 34 may be deposited on substrate 10 as discussed further in detail below. The need for sealing layer 34 may depend on the materials of cover plate 12 and substrate 10 and the method used for affixing the cover plate to the substrate. The use of sealing layer 34 may allow a relatively low-temperature process to be used, as compared to, for example, a semiconductor-to-semiconductor bonding. The sealing layer may significantly broaden the range of materials which can be used for the substrate and cover, by allowing many such materials to be joined using processes gentle enough to prevent device damage. Such damage may be generated through, for example, outgassing and/or thermal distortion.

The inclusion of recesses 36 may allow a thinner sealing layer to be used as compared to the cover embodiment shown in FIG. 4A. In particular, sealing layer 34 may include a thickness between approximately one micron and hundreds of microns. Larger or smaller thicknesses of sealing layer 34, however, may be appropriate depending on the design specifications of the circuit and the materials used. In general, sealing layer 34 may include similar materials as those used for sealing layer 30 as described in FIG. 4A. As such, sealing layer 34 may include solder, metal, ceramic, glass or adhesive such as thermoplastic, elastomeric or epoxy. Furthermore, sealing layer 34 may be arranged in a pattern, such as rings or grids. In addition or alternatively, sealing layer 34 may include one or more layers. Moreover, sealing layer 34 may be adapted to seal devices around which the layer is arranged such that a protective enclosure around devices is formed.

The cover plate, whether planar or recessed, may also be processed to include a getter material. Such a material will preferentially remove from the MEMS cavity moisture, hydrogen, carbon monoxide or dioxide or other contaminant gas or particulate matter that may impact the function of the MEMS device. Such materials could be applied either in sheet form to the inside of a cover or could be sputtered on to the cover if so desired and if the correct materials are chosen. They also could be deposited on other areas in the package such as the package substrate.

Figure 5A:
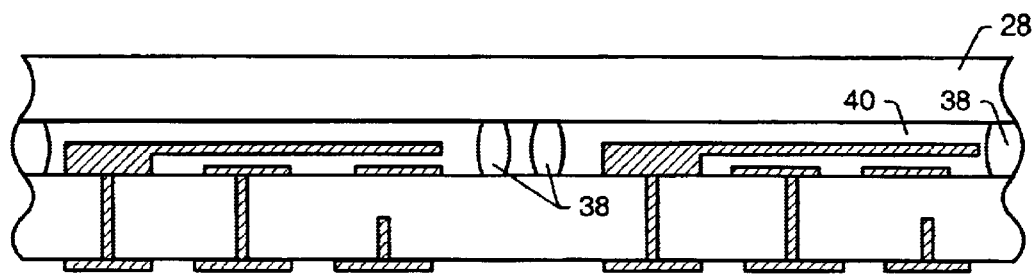
FIG. 5A shows the MEMS devices of FIG. 3 covered by the cover of FIG. 4A.

FIG. 5A illustrates the cover of FIG. 4A affixed to the substrate 10 of FIG. 3. In other embodiments, a different cover such as the cover of FIG. 4B could be used. In FIG. 5A, cover plate 28 is arranged over MEMS devices 20. Preferably, cover plate 28 is spaced sufficiently above MEMS devices 20 to permit proper electromechanical operation of the device. In addition, sealing layer 30 is affixed to substrate 10 to form sealing structure 38 interposed between substrate 10 and cover plate 28 and laterally surrounding MEMS device 20. Consequently, sealed cavity/ enclosure 40 may be formed spaced above MEMS device 20 and substrate 10. In some embodiments, sealing structures 38 may laterally surround a single device. In other embodiment sealing structures 38 may laterally surround a plurality of devices. In this manner, one or more sealing structures may be contained within the topography of FIG. 5A.

Figure 5B:
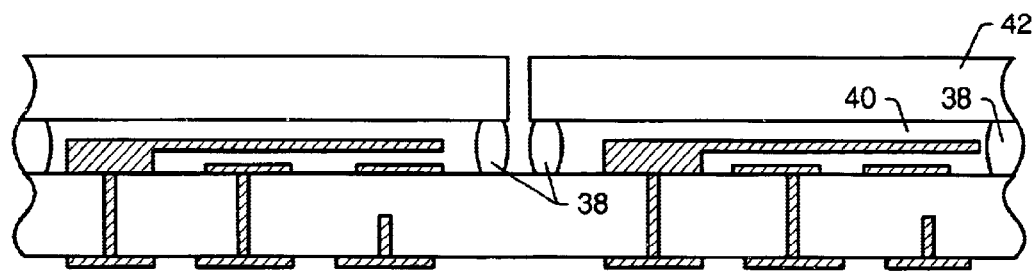
FIG. 5B shows an alternative embodiment in which each of the MEMS devices is covered with a separate cover.

In alternative embodiments, a topography may include a plurality of cover plates such as illustrated in FIG. 5B. Such an embodiment may include separate covers 42 affixed to substrate 10. As with cover plate 28, covers 42 are preferably spaced sufficiently above MEMS devices 20 to permit proper electromechanical operation of the device. In some embodiments, separate covers 42 may each cover a single device, while in other embodiments, separate covers 42 may each cover multiple devices. The placement of covers 42 may be conducted using pick-and-place technology, for example. Such a technology may be useful for selectively placing separate covers 42 over devices and not placing covers over other devices- In particular, such a selective scheme may be advantageous when devices have failed quality tests subsequent to releasing the devices. Consequently, processing time and costs may be saved by not placing separate covers 42 over such devices In addition or alternatively, testing processes may be conducted subsequent to forming cavity/enclosure 40 around one or more devices. Such a test process may be conducted through the connection pads formed upon the bottom of substrate 10, for example. Moreover, the array of devices protected and packaged in FIGS. 5A and 5B may be transported and/or provided to customers prior to singulation of substrate 10.

Affixing one or more covers to a substrate may be conducted in a variety of manners. For example, the cover may be affixed to substrate 10 by solder reflow, transient liquid phase bonding, welding, brazing, frit sealing, curing, or using polymeric adhesives. As noted above, such processes may be used to transform a sealing layer into sealing structure 38. Sealing structure 38 is preferably adapted to create cavity/enclosure 40 around one or more devices. In some cases, affixing the cover to substrate 10 may include a thermal process. For example, affixing the cover to substrate 10 by solder reflow may include heating a solder seal, such as gold-tin, with a sealing layer to form sealing structure 38. In such an embodiment, the sealing layer preferably includes a metal. In another embodiment, affixing the cover to substrate 10 may include forming a liquid phase between adjacent metal layers, such that an alloy may be produced and isothermally solidify. The resulting bond structure may advantageously have a higher melting point than the original materials. Indium/gold material set and/or tin or lead alloys may be particularly useful in such an embodiment. In other embodiments, frit or adhesive sealing may be used to create sealing structure 38. In such an embodiment, sealing structures may be located on top of interconnects 18 in some cases. In an embodiment in which an optically clear material is used for substrate 10, a UV curable adhesive may be used for the sealing layer such that a thermal process may not be needed.

Figure 6:
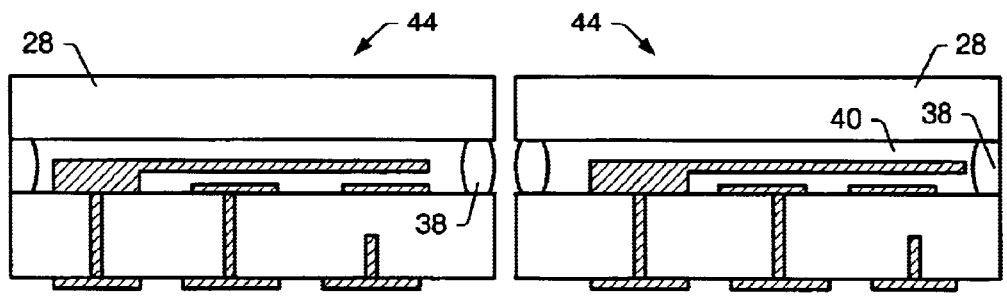
FIG. 6 shows the packaged MEMS devices of FIG. 5A after singulation of the devices.

FIG. 6 illustrates substrate 10 of FIG. 5A singulated to produce packaged, protected MEMS circuits 44. The singulation of substrate 10 of FIG. 5B (not shown) would look similar to that of FIG. 5A. In either embodiment, MEMS circuits 44 may be suitable for circuit board installation. The singulation process is preferably conducted such that substrate 10 is diced along sealing structures 38. In this manner, sealed cavity/enclosures 40 may remain intact after the singulation process such that MEMS devices 20 may be protected along the lateral sides of the circuits. Singulating into individual sealed packages may be done using tools suitable for dicing wafers and/or cutting packaging materials. In particular, tools suitable for cutting through materials of cover plate 28, sealing structures 38, and substrate 10 may be used. For example, the singulation process may include using a wafer saw or laser cutting, for example. In some embodiments, it may be desirable to have cover plate 28 grounded. Grounding cover plate 28 may prevent charging and electromagnetic interference of the devices, and may also improve high-frequency performance. In such an embodiment, cover 28 and sealing structure 38 may include a conductive material such as conductive cement or alloyed metals. Grounding may be achieved by coupling sealing structure 38, and thereby cover plate 28, to conductive features 16 on the bottom surface of substrate 10. This can be done by arranging for sealing structure 38 to contact one or more of interconnects 18, possibly using interconnect formed on the upper surface of substrate 10. The appropriate conductive features 16 can be connected to the circuit board ground, thereby grounding the sealing structure and cover.

Figure 7:
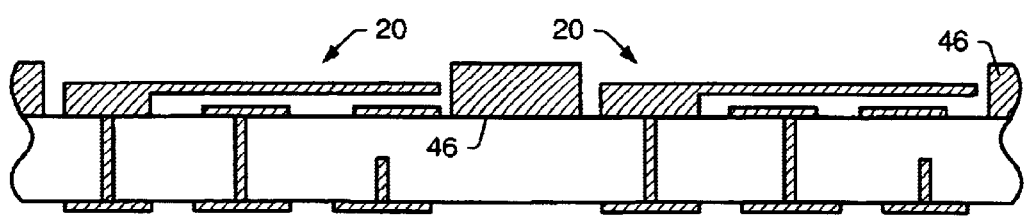
FIG. 7 is a partial cross-sectional view of an alternative embodiment in which a sealing structure is formed on the packaging substrate before a cover is affixed.

FIG. 7 illustrates an alternative embodiment of a topography including MEMS devices 20 arranged over substrate 10. In particular, FIG. 7 illustrates sealing layer 46 formed on substrate 10 and laterally surrounding MEMS devices 20. In general, the topography of FIG. 7 may be formed using the processes described in FIGS. 1–3 with the additional formation of sealing layer 46. In addition, sealing layer 46 may include similar materials as those described for sealing layers 30 and 34 above. As such sealing layer 46 may include the above-described adhesives, solder, metal, epoxy, ceramic, or glass. In some embodiments, sealing layer 46 may include the same type of material as elements 24 and 25 and/or cantilever element 26. In such an embodiment, sealing layer 46 may be formed at the same time as some or all of these elements. In an alternative embodiment, sealing layer 46 may include a different material than element 24 and cantilever element 26, and therefore may be formed separate from element 24 and cantilever element 26. Sealing layer 46 may be formed using similar lithography, deposition and etching techniques as those used to form elements 24, 25 and 26 and thus may be formed before, during or after the formation of some or all of these elements, but prior to the releasing process described in FIG. 3.

In some embodiments, sealing layer 46 may be combined with a corresponding sealing layer of a cover, such as those illustrated in FIGS. 4A and 4B, to affix the cover to substrate 10 and form a sealing structure interposed between the substrate 10 and the cover, such as sealing structure 38. For example, in one embodiment, sealing layer 46 may include gold and the sealing layer on the cover may include indium. In such an embodiment, affixing the cover to substrate 10 may include heating the layers to form gold/indium alloy. A similar sort of alloying may be done with other metals systems, such as tin/lead, for example. The choice of metallic materials is made such that one metal or alloy will melt at a low temperature and dissolve in the other metal, forming a higher melting point alloy. The bond solidifies isothermally resulting in a seal which can tolerate higher temperatures than the original metals used in the seal. In other embodiments, sealing layer 46 may represent the entire sealing layer with which to bond with a cover plate to form a sealed enclosure about MEMS devices 20 and more specifically spaced above MEMS devices 20 and substrate 10. In such an embodiment, sealing layer 46 may include any metal with which to alloy with a metal cover plate. Another metal to metal sealing configuration that may be used is gold to gold thermocompression bonding. Other soldering or brazing materials may also be used to form the seal. However, the joining should be performed in such a way as to eliminate exposure of the MEMS structures to fluxes normally used in soldering or brazing.

Figure 8A:
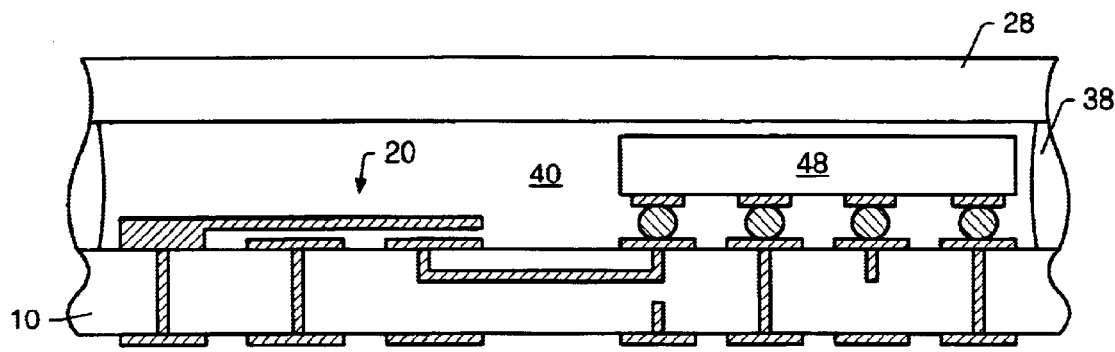
FIG. 8A is a partial cross-sectional view of a packaged MEMS device in which an integrated circuit is also included within the package.

An alternative package configuration fabricated from the method described herein is illustrated in FIG. 8A. In particular, a topography is illustrated which includes integrated circuit 48 spaced apart from MEMS device 20 and included within cavity/enclosure 40. Such an enclosure is bounded by substrate 10, sealing structure 38, and cover plate 28. However, in other embodiments, the enclosure may be bounded only by substrate 10 and cover plate 28. As noted above, the drawings, including FIGS. 8A and 8B, are not to scale. For example, the thickness of integrated circuit 48 may in some embodiments be between about 300 and 600 microns, while that of MEMS device 20 may be on the order of a few microns. The configuration of FIG. 8A may therefore involve modifications such as a particularly thick sealing structure 38, or possibly a thinning of the substrate of IC 48.

Integrated circuit 48 may be fabricated before or after the formation of MEMS device 20. In particular, integrated circuit 48 may be fabricated on package substrate 10 before, during or after MEMS fabrication or attached to the packaging substrate via flip-chip or wirebond technology before or after the release of MEMS device 20. In an embodiment for which substrate 10 is a semiconductor substrate, and IC 48 is fabricated directly into substrate 10, the fabrication sequence of integrated circuit 48 and MEMS device 20 may depend on the likelihood of introducing contaminants onto the topography during the integrated fabrication process. In an embodiment for which substrate 10 is not a semiconductor, integrated circuit 48 may be separately bonded to substrate 10. Flip-chip bonding with solder bumps to pads on the surface of substrate 10 is shown in FIG. 8A. An IC could also be attached face-up with wire-bonding connections made to pads on the substrate and/or to MEMS device 20. In some embodiments, integrated circuit 48 may be electrically coupled to MEMS device 20 using an interconnect within substrate 10. In other embodiments, integrated circuit 48 may be electrically coupled to other devices, such as other MEMS devices or integrated circuits arranged on substrate 10. Preferably, integrated circuit 48 is electrically coupled to devices which are arranged within same die portion of substrate 10. In this manner, the coupled devices may be adapted to be operable through application of electrical signals through conductive features within and on substrate 10 before and after the singulation process described in reference to FIG. 6 above.

Figure 8B:
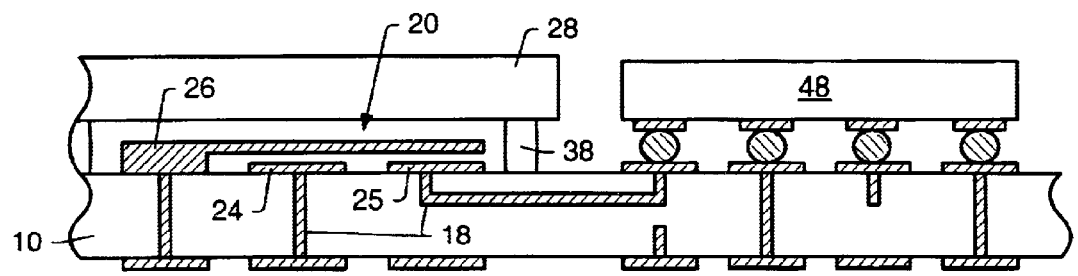
FIG. 8B is a partial cross-sectional view of an alternative embodiment in which an integrated circuit is mounted outside of the protective enclosure around a MEMS device.

An alternative embodiment of a circuit including a packaged MEMS device and an integrated circuit is shown in FIG. 8B. In the embodiment of FIG. 8B, cover 28 extends only over MEMS device 20, while IC 48 is left uncovered. This configuration could be achieved using a single cover 28 for the entire substrate in which openings are formed in portions which will overlie integrated circuit positions on substrate 10 once the cover is affixed. Alternatively, an individual cover could be affixed over each MEMS device. Either type of cover may be affixed using techniques discussed above in the descriptions of FIGS. 5 and 7. Covering only the MEMS devices may advantageously allow them to be protected while the integrated circuits are attached. A protective dielectric coating may subsequently be applied over the mounted integrated circuit to protect it, as is often done in IC technology. Although the IC is shown flip-chip mounted in FIGS. 8A and 8B, it could alternatively be mounted face-up, as noted above. The IC may be electrically coupled to the MEMS device through interconnects 18, possibly in conjunction with interconnects formed on the upper surface of substrate 10.

Figure 9:
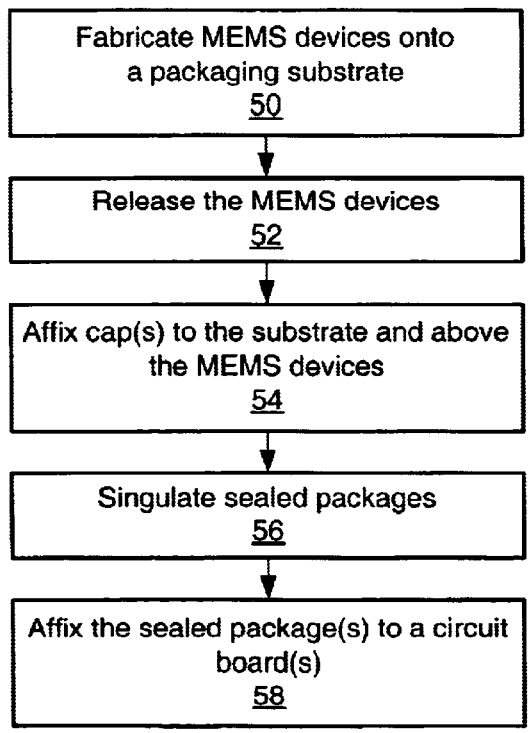
FIG. 9 is a flow diagram illustrating an embodiment of a method for fabricating and packaging MEMS devices as described herein.

A flowchart of the method described herein is illustrated in FIG. 9. As described in reference to FIGS. 1–8B, such a method may include fabricating MEMS devices onto a packaging substrate as shown in step 50. The method may further include releasing the MEMS devices in step 52 and affixing one or more covers over the MEMS devices in step 54. In step 56, the sealed devices are singulated. Subsequently, the method may include step 58, which may include affixing the singulated sealed devices to circuit boards. The fabrication of MEMS devices directly on a packaging substrate may advantageously reduce the packaged size of the circuit. In addition, eliminating the need to wire-bond a separate MEMS chip to a packaging substrate may allow better high-frequency performance of the device. Moreover, the method described herein allows a device to be packaged as an integral part of the fabrication process of the devices at the "wafer-level", thereby reducing handling of the devices and fabrication costs.

It will be appreciated to those skilled in the art having the benefit of this disclosure that this invention is believed to provide a packaged, protected MEMS device structure and a method for forming such a structure. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A microelectromechanical circuit, comprising:
   a packaging substrate having one or more conductive features upon its lower surface;
   a microelectromechanical device formed upon the upper surface of the substrate, wherein an underside of at least one element of the device is in contact with the upper surface of the substrate; and
   a cover spaced above the device and the substrate, wherein the substrate and the cover combine to form a protective enclosure around the device, and wherein the cover comprises a getter material adapted to remove contaminant gas or particulate matter from within the protective enclosure.

2. The circuit of claim 1, wherein the conductive features are adapted for use in electrical coupling of the substrate to a circuit board or circuit carrier.

3. The circuit of claim 1, further comprising one or more conductive interconnects extending within and through the substrate, wherein at least one conductive element of the device is coupled to at least one of the conductive interconnects.

4. The circuit of claim 1, wherein the cover is spaced sufficiently above the device to permit proper electromechanical operation of the device.

5. The circuit of claim 1, wherein a lower surface of the cover comprises a recessed portion aligned over the device.

6. The circuit of claim 1, further comprising a sealing structure interposed between the substrate and the cover, wherein the sealing structure laterally surrounds the device.

7. The circuit of claim 6, wherein the sealing structure comprises an organic material.

8. The circuit of claim 6, wherein the sealing structure comprises a metallic material.

9. The circuit of claim 6, wherein the cover comprises a transparent material, and the sealing structure comprises an adhesive curable using ultraviolet radiation.

10. The circuit of claim 6, wherein the substrate, cover, and sealing structure combine to form the protective enclosure around the device.

11. The circuit of claim 6, further comprising a semiconductor-based integrated circuit laterally spaced from the device and attached to the upper surface of the substrate.

12. The circuit of claim 11, wherein the integrated circuit and the device are laterally surrounded by the sealing structure.

13. The circuit of claim 11, wherein the integrated circuit is arranged laterally outside of the sealing structure.

14. The circuit of claim 1, wherein the packaging substrate comprises a ceramic material.

15. The circuit of claim 14, wherein the ceramic material comprises alumina.

16. The circuit of claim 1, wherein the conductive features comprise conductive pads, pins, balls or bumps.

17. The circuit of claim 1, wherein the element of the microelectromechanical device comprises a metal.

18. The circuit of claim 17, wherein the metal comprises gold.

19. The circuit of claim 1, further comprising a semiconductor-based integrated circuit laterally spaced from the device and attached to the upper surface of the substrate.

20. The circuit of claim 19, wherein the device is electrically coupled to the integrated circuit through one or more conductive interconnects within the substrate.

21. An array of microelectromechanical circuits, said array comprising:

a packaging substrate having multiple conductive features upon its lower surface;

first and second microelectromechanical devices formed laterally spaced upon the upper surface of the packaging substrate, wherein an underside of at least one element of each device is in contact with the upper surface of the substrate;

first and second covers spaced above the substrate and the first and second devices, respectively;

a sealing structure interposed between the substrate and the first and second covers, wherein the sealing structure laterally surrounds each of the first and second devices; and wherein the substrate, sealing structure, and first and second covers combine to form a protective enclosure for each of the first and second devices, and wherein the cover comprises a getter material adapted to remove contaminant gas or particulate matter from within the protective enclosure.

22. The array of claim 21, wherein the first and second covers are portions of a single cover for the array.

23. The array of claim 21, wherein the protective enclosures are adapted to remain intact after separation of the substrate portion underlying the first device from that underlying the second device, wherein the separation comprises cutting through the substrate.

24. The array of claim 23, wherein the first and second devices are adapted to be operable through application of electrical signals to appropriate ones of the conductive features, either before or after said separation.

* * * * *

UNITED STATES PATENT AND TRADEMARK OFFICE
CERTIFICATE OF CORRECTION

PATENT NO. : 6,624,003 B1 Page 1 of 1
DATED : September 23, 2003
INVENTOR(S) : Rice et al.

It is certified that error appears in the above-identified patent and that said Letters Patent is hereby corrected as shown below:

Title page,
Item [75], Inventors, please add the following:
-- Ian Ying Kit Yee, Austin, TX (US); Cory G. Tourino, Austin, TX (US) --.

Signed and Sealed this

Twenty-seventh Day of April, 2004

JON W. DUDAS
*Acting Director of the United States Patent and Trademark Office*